(12) United States Patent
Kim et al.

(10) Patent No.: US 11,973,142 B2
(45) Date of Patent: *Apr. 30, 2024

(54) INTEGRATED CIRCUIT INCLUDING TRANSISTORS AND A METHOD OF MANUFACTURING THE SAME

(71) Applicant: Samsung Electronics Co., Ltd., Suwon-si (KR)

(72) Inventors: Sangwook Kim, Seongnam-si (KR); Yunseong Lee, Osan-si (KR); Sanghyun Jo, Seoul (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/888,649

(22) Filed: Aug. 16, 2022

(65) Prior Publication Data

US 2022/0393032 A1 Dec. 8, 2022

Related U.S. Application Data

(63) Continuation of application No. 16/682,512, filed on Nov. 13, 2019, now Pat. No. 11,417,763.

(30) Foreign Application Priority Data

Dec. 13, 2018 (KR) .................. 10-2018-0161185

(51) Int. Cl.
*H01L 29/78* (2006.01)
*H01L 21/28* (2006.01)
(Continued)

(52) U.S. Cl.
CPC .. *H01L 29/78391* (2014.09); *H01L 21/28185* (2013.01); *H01L 21/823412* (2013.01);
(Continued)

(58) Field of Classification Search
CPC ......... H01L 29/78391; H01L 21/28185; H01L 21/823412; H01L 21/823418;
(Continued)

(56) References Cited

U.S. PATENT DOCUMENTS 6,563,182 B2 5/2003 Horikawa
7,626,246 B2 12/2009 Lochtefeld et al.
(Continued)

FOREIGN PATENT DOCUMENTS

JP 4895430 B2 3/2012

*Primary Examiner* — Monica D Harrison
*Assistant Examiner* — Andre C Stevenson
(74) *Attorney, Agent, or Firm* — HARNESS, DICKEY & PIERCE, P.L.C.

(57) ABSTRACT

An integrated circuit includes transistors respectively including channel layers in a substrate, source electrodes and drain electrodes respectively contacting both sides of the channel layers, gate electrodes on the channel layers, and ferroelectrics layers between the channel layers and the gate electrodes. Electrical characteristics of the ferroelectrics layers of at least two of the transistors are different. Accordingly, threshold voltages of the transistors are different from each other.

20 Claims, 16 Drawing Sheets

(51) Int. Cl.
  *H01L 21/8234* (2006.01)
  *H01L 27/088* (2006.01)
  *H01L 29/51* (2006.01)
  *H01L 29/66* (2006.01)

(52) U.S. Cl.
  CPC .......... *H01L 21/823418* (2013.01); *H01L 21/823437* (2013.01); *H01L 27/088* (2013.01); *H01L 29/513* (2013.01); *H01L 29/516* (2013.01); *H01L 29/517* (2013.01); *H01L 29/6684* (2013.01)

(58) Field of Classification Search
  CPC ........... H01L 21/823437; H01L 27/088; H01L 29/513; H01L 29/516; H01L 29/517; H01L 29/6684
  See application file for complete search history.

(56) References Cited

U.S. PATENT DOCUMENTS

| | | |
|---|---|---|
| 8,357,604 B2 | 1/2013 | Hoentschel et al. |
| 11,417,763 B2 * | 8/2022 | Kim .................. H01L 21/28185 |
| 2012/0086059 A1 | 4/2012 | Dubourdieu et al. |
| 2013/0270619 A1 * | 10/2013 | Schloesser ........ H01L 29/78391 |
| | | 257/295 |
| 2013/0334608 A1 | 12/2013 | Ikoma et al. |
| 2015/0303115 A1 | 10/2015 | Liu et al. |
| 2018/0350800 A1 | 12/2018 | Chang et al. |
| 2019/0172539 A1 * | 6/2019 | Slesazeck ......... H01L 29/40111 |
| 2019/0296122 A1 | 9/2019 | Ino et al. |
| 2020/0020762 A1 | 1/2020 | Frank et al. |

* cited by examiner

INTEGRATED CIRCUIT INCLUDING TRANSISTORS AND A METHOD OF MANUFACTURING THE SAME

CROSS-REFERENCE TO RELATED APPLICATION

This application is a continuation of U.S. application Ser. No. 16/682,512 (now U.S. Pat. No. 11,417,763), filed Nov. 13, 2019, which claims the benefit of Korean Patent Application No. 10-2018-0161185, filed on Dec. 13, 2018, in the Korean Intellectual Property Office, the disclosure of each of which is incorporated herein in its entirety by reference.

BACKGROUND

1. Field

The present disclosure relates to an integrated circuit including transistors and a method of manufacturing the same.

2. Description of the Related Art

Recently, demand for electronic products that use integrated circuits including transistors has been on the rise. To satisfy such demand, research into integrated circuits having improved performance is actively underway.

In particular, there have been attempts to decrease the amount of power consumed by transistors included in integrated circuits. For example, it is possible to decrease power consumed by semiconductor devices by adjusting threshold voltages of the transistors. In other words, when the threshold voltages of the transistors are differently set to make them have appropriate threshold voltages depending on their usage, a total amount of power consumed by an integrated circuit may decrease.

SUMMARY

Provided is an integrated circuit including transistors having different threshold voltages, and a method of manufacturing the integrated circuit.

Additional aspects will be set forth in part in the description which follows and, in part, will be apparent from the description, or may be learned by practice of the presented embodiments.

According to an aspect of an embodiment, there is provided an integrated circuit including a plurality of transistors on a substrate. Each of the plurality of transistors includes a channel layer in the substrate, a source electrode and a drain electrode that respectively contact both sides of the channel layer; a gate electrode on the channel layer, and a ferroelectrics layer between the channel layer and the gate electrode. The ferroelectrics layers of at least two of the plurality of transistors have different electrical characteristics.

In some embodiments, the ferroelectrics layers of the at least two transistors may have the same chemical compositions.

In some embodiments, at least one of crystalline phases, grain sizes, and defect densities of the ferroelectrics layers of the at least two transistors may be different.

In some embodiments, at least one of materials and thicknesses of the gate electrodes of the at least two transistors may be different.

In some embodiments, each of the plurality of transistors may further include an insulating layer between the ferroelectrics layer and the channel layer.

In some embodiments, the insulating layer may include a 2-dimensional (2D) material, and the 2D material may include at least one of SiO, SiN, AlO, HfO, ZrO, or h-BN.

In some embodiments, each of the at least two transistors may further include a metal layer and an insulating layer. The metal layer may be between the insulating layer and the ferroelectrics layer.

In some embodiments, at least one of materials and thicknesses of the at least two transistors may be different.

In some embodiments, at least one of materials and thicknesses of the metal layers of the at least two transistors may be different.

In some embodiments, each of the at least two transistors may further include a metal layer and an insulating layer. The metal layer may be between the gate electrode and the ferroelectrics layer. The insulating layer may be between the metal layer and the gate electrode.

In some embodiments, at least one of materials and thicknesses of the metal layers of the at least two transistors may be different.

In some embodiments, the ferroelectrics layer may include at least one of $HfO_2$, $Hf_xZr_{1-x}O_2$ (0<x<1) or $ZrO_2$.

In some embodiments, the channel layer may include Si, Ge, a III-V semiconductor compound, a 2D material, a transition-metal dichalcogenides (TMDC), or an organic semiconductor.

In some embodiments, the channel layers of the at least two transistors may have the same doping concentration.

According to an aspect of another embodiment, a method of manufacturing an integrated circuit including a plurality of transistors is provided. The method may include forming a semiconductor substrate including a plurality of channel layers, a plurality of source electrodes, and a plurality of drain electrodes; forming a plurality of stack structures; and performing a heat treatment on the plurality of stack structures. The forming the plurality of stack structures may include forming ferroelectrics layers and gate electrodes sequentially on the plurality of channel layers.

In some embodiments, the ferroelectrics layers of the plurality of stack structures may have a same chemical composition.

In some embodiments, at least one of materials and thicknesses of the gate electrodes of at least two of the plurality of stack structures may be different.

In some embodiments, at least two of the plurality of stack structures may further include metal layers between the plurality of channel layers and the plurality of gate electrodes. The metal layers may contact the ferroelectrics layers of the at least two of the plurality of stack structures.

In some embodiments, at least one of materials and thicknesses of the metal layers of the at least two stack structures may be different.

In some embodiments, the plurality of stack structures may include a first stack structure and a second stack structure. The performing of the heat treatment may include performing a first heat treatment on the first stack structure and performing a second heat treatment on the second stack structure. The first heat treatment and the second heat treatment may have different heat temperatures, different periods, or both different heat temperatures and different periods.

According to an aspect of an embodiment, an integrated circuit may include a plurality of transistors on a substrate. Each of the plurality of transistors including a channel layer in the substrate, a source electrode and a drain electrode that respectively contact both sides of the channel layer, a gate electrode on the channel layer, and a ferroelectrics layer between the channel layer and the gate electrode. The plurality of transistors may include a first transistor and a second transistor. The ferroelectrics layer of the first transistor may be configured to have different electrical characteristics than the ferroelectrics layer of the second transistor.

In some embodiments, a chemical composition of the ferroelectrics layer for the first transistor may be the same as a chemical composition of the ferroelectrics layer of the second transistor.

In some embodiments, the first transistor may further include an insulating layer, a metal layer, or both the insulating layer and the metal layer between the gate electrode and the channel layer of the first transistor.

In some embodiments, the metal layer of the first transistor may be different than the metal layer of the second transistor in terms of a material, a thickness, or both the material and the thickness.

In some embodiments, the gate electrode of the first transistor may be different than the gate electrode of the second transistor in terms of a material, a thickness, or both the material and the thickness.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
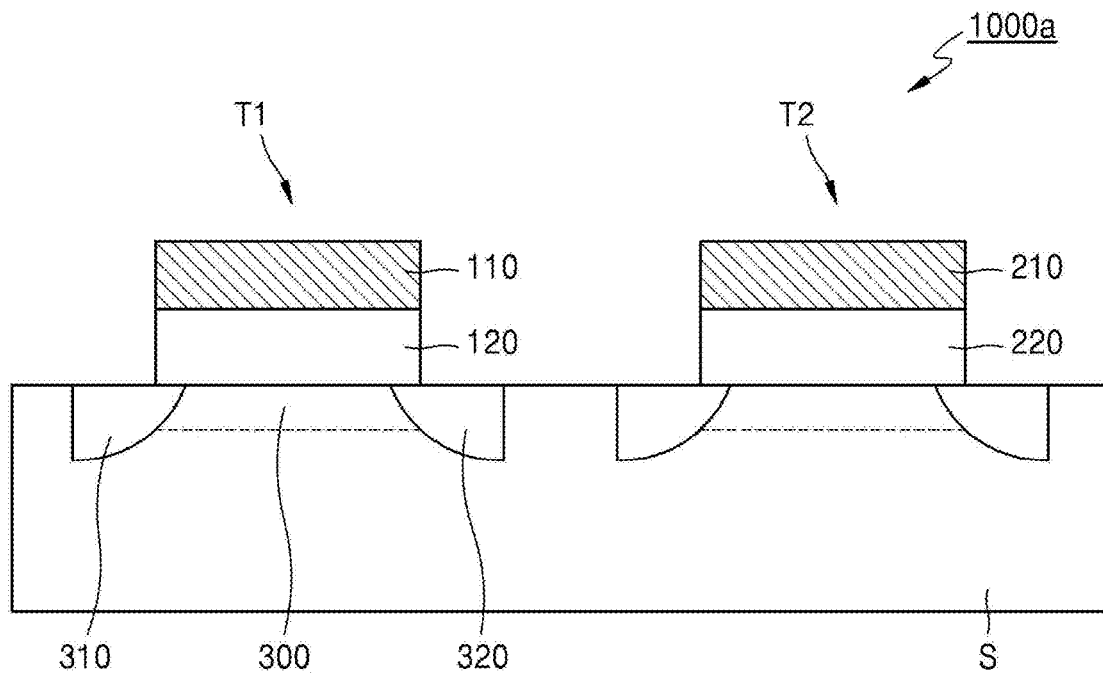
FIGS. 1A to 1B are schematic cross-sectional views of integrated circuits including transistors, according to some embodiment.

Reference will now be made in detail to embodiments, examples of which are illustrated in the accompanying drawings, wherein like reference numerals refer to like elements throughout. In this regard, the presented embodiments may have different forms and inventive concepts should not be construed as being limited to the descriptions set forth herein. Accordingly, the embodiments are merely described below, by referring to the figures, to explain aspects of inventive concepts. As used herein, the term "and/or" includes any and all combinations of one or more of the associated listed items. Expressions such as "at least one of", when preceding a list of elements, modify the entire list of elements and do not modify the individual elements of the list.

Hereinafter, an integrated circuit including transistors and a method of manufacturing the same will be described in detail by explaining embodiments of inventive concepts with reference to the attached drawings. Like reference numerals in the drawings denote like elements, and sizes or thicknesses of components in the drawings may be exaggerated for convenience of explanation.

It will be understood that although the terms "first", "second", etc. may be used herein to describe various components, these components should not be limited by these terms. These components are only used to distinguish one component from another. An integrated circuit including transistors and a method of manufacturing the same may be embodied in many different forms and should not be construed as being limited to the embodiments set forth herein.

It will be further understood that the terms "comprises" and/or "comprising" used herein specify the presence of stated features or components, but do not preclude the presence or addition of one or more other features or components.

When threshold voltages of transistors included in an integrated circuit are differently set, power loss of the integrated circuit may decrease. Methods of differently setting threshold voltages of transistors include a method of differently setting doping concentrations of transistors. These methods enable the adjustment of threshold voltages by primarily performing doping corresponding to a desired threshold voltage on transistors and then additionally performing doping on a desired transistor. As described, when a method of adjusting threshold voltages according to doping concentrations of transistors is used, it may be difficult to adjust dispersion of the doping concentrations as the transistors decrease in size.

Besides, threshold voltages of transistors included in an integrated circuit may be adjusted by using a method of controlling lengths of channel layers, a method of adjusting work functions of gate electrodes, and the like. However, the aforementioned methods have complicated processes, and it may be difficult to acquire desired threshold voltages by using the methods.

Hereinafter, an integrated circuit, which includes transistors having different threshold voltages because of ferroelectrics layers having different electrical characteristics, will be described.

Figure 1B:
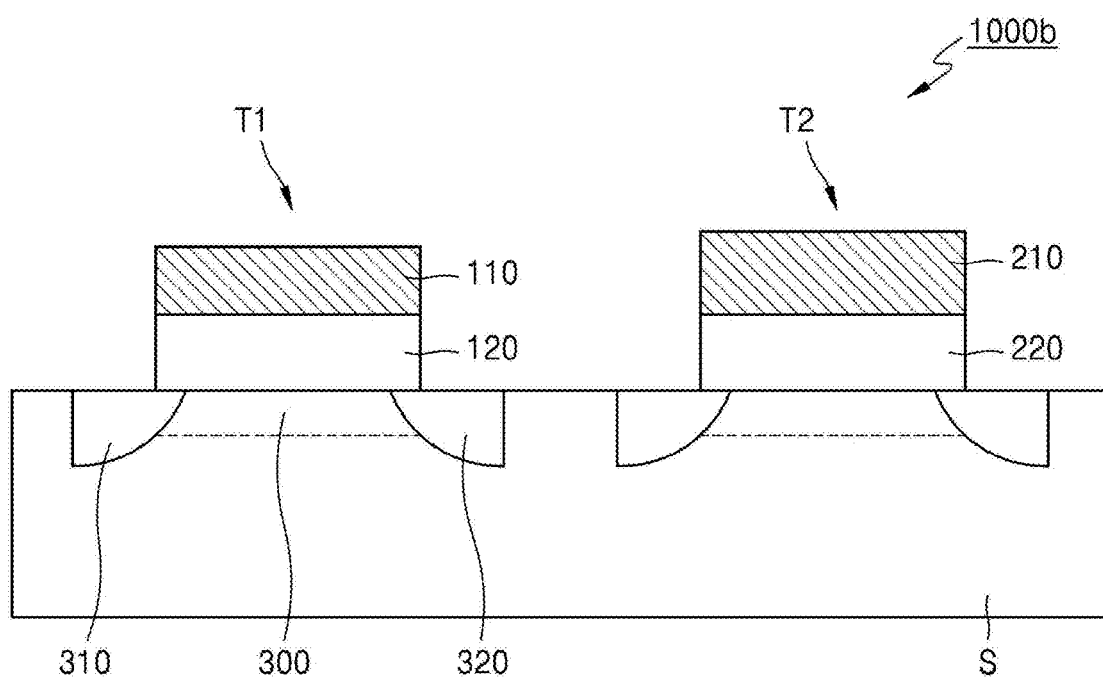
Figure 2:
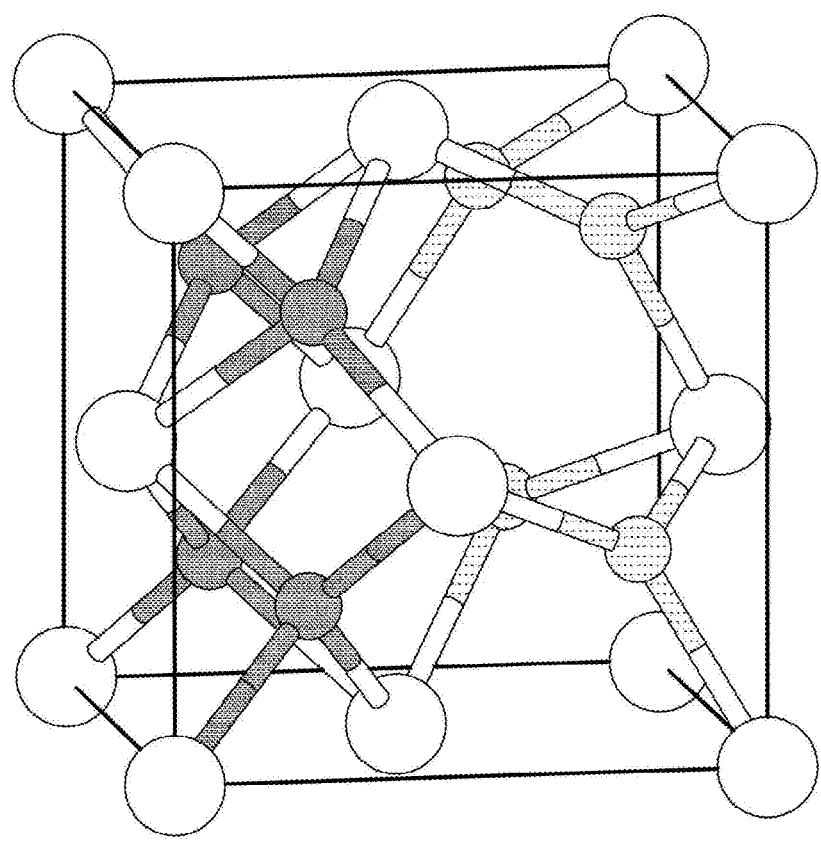
FIGS. 2 to 4 briefly show various crystalline phases of a first or second ferroelectrics layer.
Figure 3:
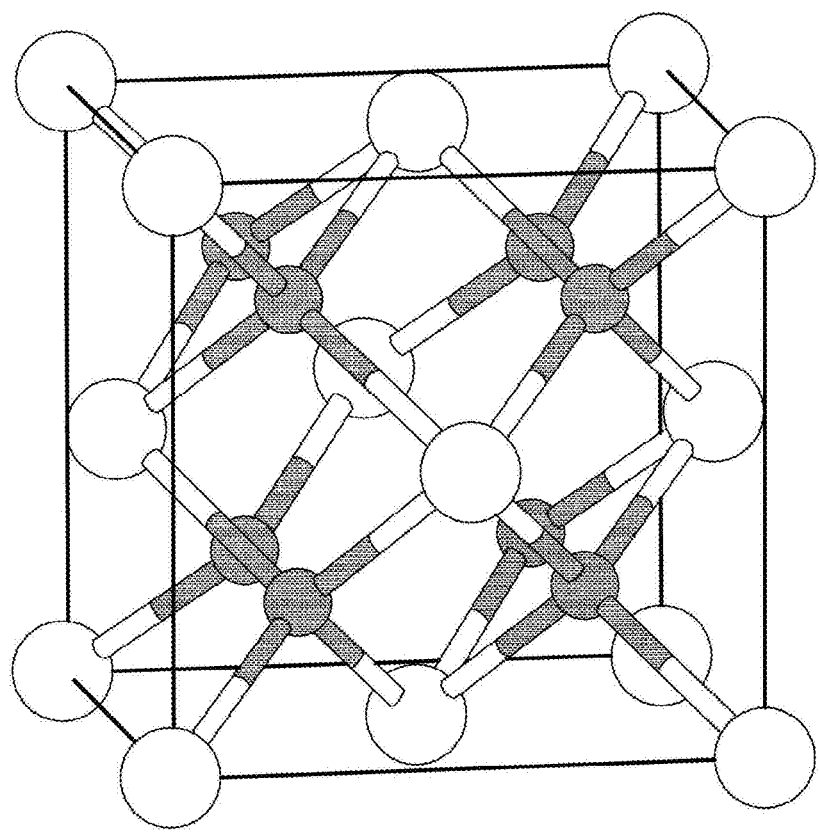
Figure 4:
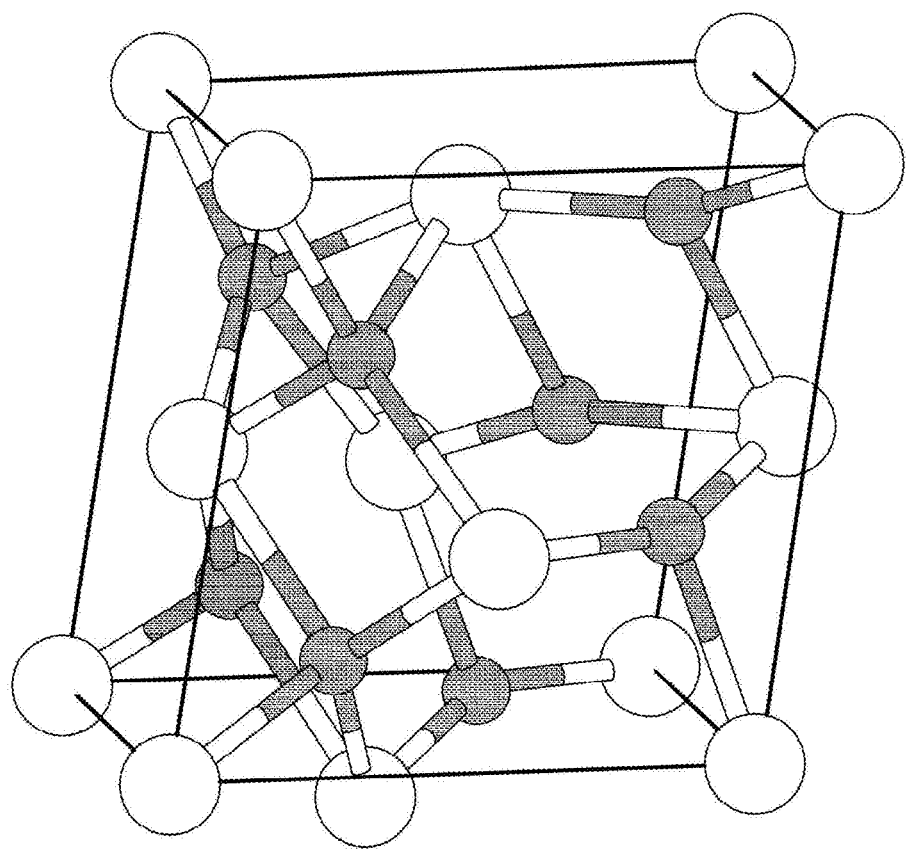
Figure 5:
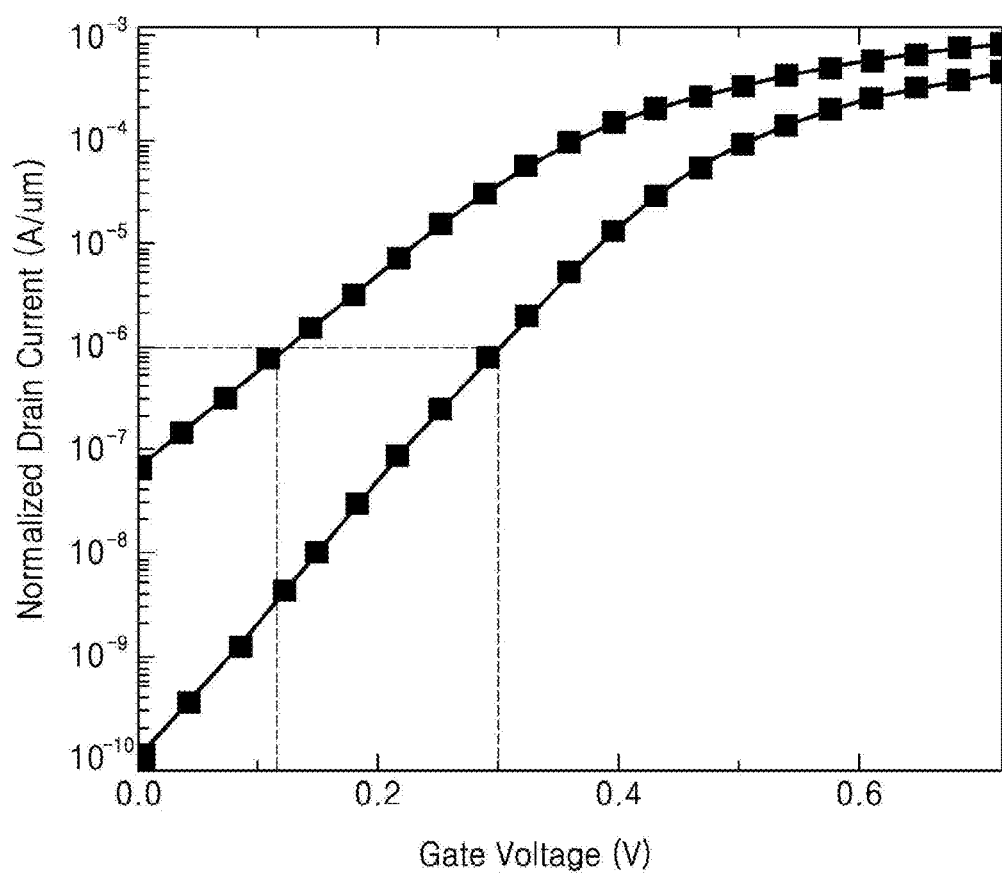
FIG. 5 is a graph used to compare threshold voltages of a first transistor and a second transistor of FIG. 1.

FIGS. 1A to 1B are schematic cross-sectional views of integrated circuits 1000a to 1000d including transistors, according to an embodiment. FIGS. 2 to 4 briefly show various crystalline phases of a first or second ferroelectrics layer 120 or 220. FIG. 5 is a graph used to compare threshold voltages of a first transistor T1 and a second transistor T2 of FIG. 1A.

Referring to FIGS. 1A and 1B, the integrated circuits 1000a and 1000b may include a substrate S and transistors respectively including, channel layers 300 in the substrate S, source electrodes 310 and drain electrodes 320 respectively contacting both sides of the channel layers 300, first and second gate electrodes 110 and 210 on the channel layers 300, and the first and second ferroelectrics layers 120 and 220 between the channel layers 300 and the first and second gate electrodes 110 and 210. Also, electrical characteristics of the first ferroelectrics layer 120 and the second ferroelectrics layer 220 respectively included in at least two of the transistors, for example, the first transistor T1 and the second transistor T2, may differ from each other. The different electrical characteristics of the first ferroelectrics layer 120 and the second ferroelectrics layer 220 may result from the first gate electrode 110 and the second gate electrode 210 respectively included in the first transistor T1 and the second transistor T2. Threshold voltages of the first and second transistors T1 and T2 that respectively include the first ferroelectrics layer 120 and the second ferroelectrics layer 220 having different electrical characteristics may differ from each other.

A structure in which the channel layer 300, the source electrode 310, and the drain electrode 320 are on the substrate S may be identical to that of a general transistor.

The first ferroelectrics layer 120 and the second ferroelectrics layer 220 may have the same chemical compositions. For example, the first ferroelectrics layer 120 and the second ferroelectrics layer 220 may each include any one of $HfO_2$, $Hf_xZr_{1-x}O_2$ (0<x<1), and $ZrO_2$. Alternatively, the first ferroelectrics layer 120 and the second ferroelectrics layer 220 may each include a material obtained by doping any one of $HfO_2$, $Hf_xZr_{1-x}O_2$ (0<x<1), and $ZrO_2$ with at least one of Si, Al, Zr, Y, La, Gd, Sr, and Hf. However, this is merely an example, and the chemical compositions of the first ferroelectrics layer 120 and the second ferroelectrics layer 220 are not limited thereto.

At least one of a crystalline phase, a grain size, and a defect density of the first ferroelectrics layer 120 and the second ferroelectrics layer 220 may differ. The electrical characteristics of the first ferroelectrics layer 120 and the second ferroelectrics layer 220 may differ.

FIG. 2 briefly shows a case where a material of the first ferroelectrics layer 120 or the second ferroelectrics layer 220 has a orthorhombic phase. In this case, the first ferroelectrics layer 120 or the second ferroelectrics layer 220 may have ferroelectricity. FIG. 3 briefly shows a case where a material of the first ferroelectrics layer 120 or the second ferroelectrics layer 220 has a tetragonal phase. In this case, the first ferroelectrics layer 120 or the second ferroelectrics layer 220 may have anti-ferroelectricity. FIG. 4 briefly shows a case where a material of the first ferroelectrics layer 120 or the second ferroelectrics layer 220 has a monoclinic phase. In this case, the first ferroelectrics layer 120 or the second ferroelectrics layer 220 may include a dielectric. The first ferroelectrics layer 120 and the second ferroelectrics layer 220 may have different crystalline phases from among the above-described crystalline phases. The electrical characteristics of each of the first ferroelectrics layer 120 and the second ferroelectrics layer 220 may be determined by the crystalline phase of each of the first ferroelectrics layer 120 and the second ferroelectrics layer 220.

Moreover, as the grain sizes or the defect densities of the first ferroelectrics layer 120 and the second ferroelectrics layer 220 differ, the electrical characteristics of the first ferroelectrics layer 120 and the second ferroelectrics layer 220 may differ. The defect densities indicate any one of oxide vacancy and metal vacancy of the first ferroelectrics layer 120 and the second ferroelectrics layer 220.

As described above, the electrical characteristics of the first ferroelectrics layer 120 and the second ferroelectrics layer 220 may differ. Accordingly, the threshold voltages of the first and second transistors T1 and T2 may differ. Referring to FIG. 5, for example, when a voltage of when a normalized drain current is $10^{-6}$ A/um is referred to as a threshold voltage, the threshold voltage of the first transistor T1 may be about 0.1 V, and the threshold voltage of the second transistor T2 may be about 0.3 V.

Referring back to FIGS. 1A and 1B, the channel layers 300 may be in the substrate S. The channel layers 300 may each include, for example, any one of Si, Ge, a III-V chemical compound, a 2-dimensional (2D) material (e.g., graphene), transition-metal dichalcogenides (TMDC) (e.g., $MoS_2$), and an organic semiconductor. Also, the channel layers 300 included in the first transistor T1 and the second transistor T2 may have the same doping concentration. Therefore, the effects of the channel layers 300 on the threshold voltages of the first transistor T1 and the second transistor T2 may be identical.

Also, referring to FIGS. 1A and 1B, any one of materials and thicknesses of the first and second gate electrodes 120 and 220 may be different. In FIG. 1A, the first and second gate electrodes 110 and 210 may have the same thickness. In FIG. 1B, the first and second gate electrodes 110 and 210 of the integrated circuit 1000b may have different thicknesses (e.g., the second gate electrode 210 may be thicker than the first gate electrode 110).

In FIGS. 1A to 1B, the first and second gate electrodes 120 and 220 may include metal. For example, the first and second gate electrodes 120 and 220 independently may include any one of Pt, Ru, Au, Ag, Mo, Al, W, and Cu that have high electrical conductivity. However, materials of the first and second gate electrodes 120 and 220 are not limited thereto.

Figure 6A:
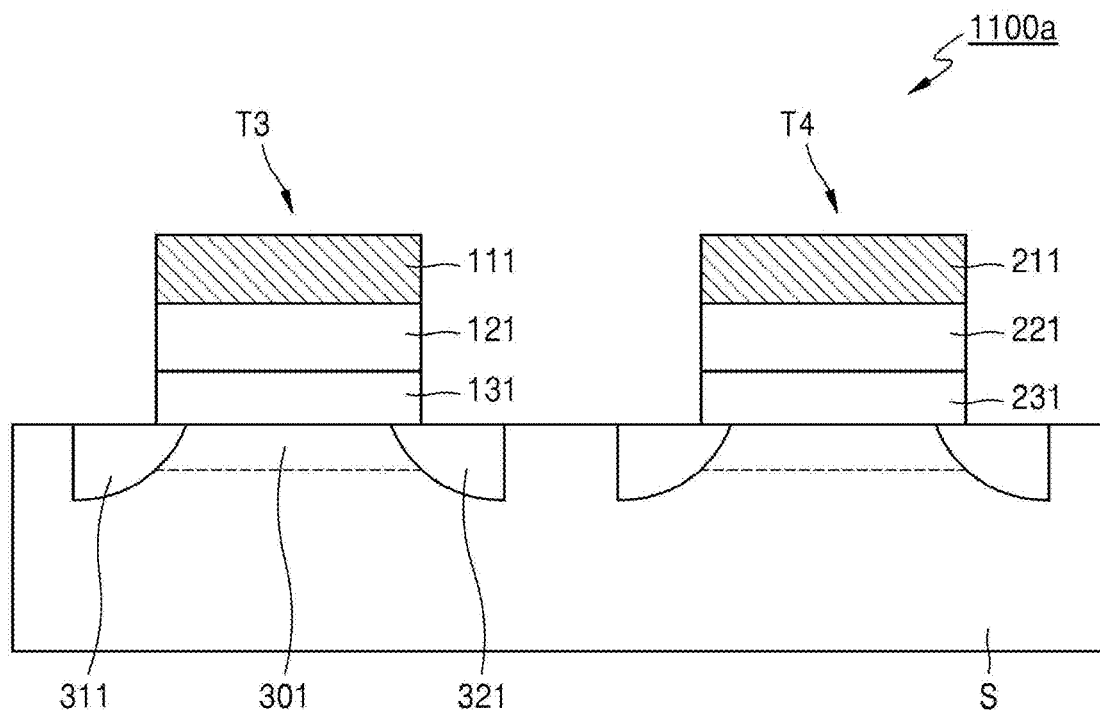
FIGS. 6A to 6B are schematic cross-sectional views integrated circuits including transistors, according to some embodiments.
Figure 6B:
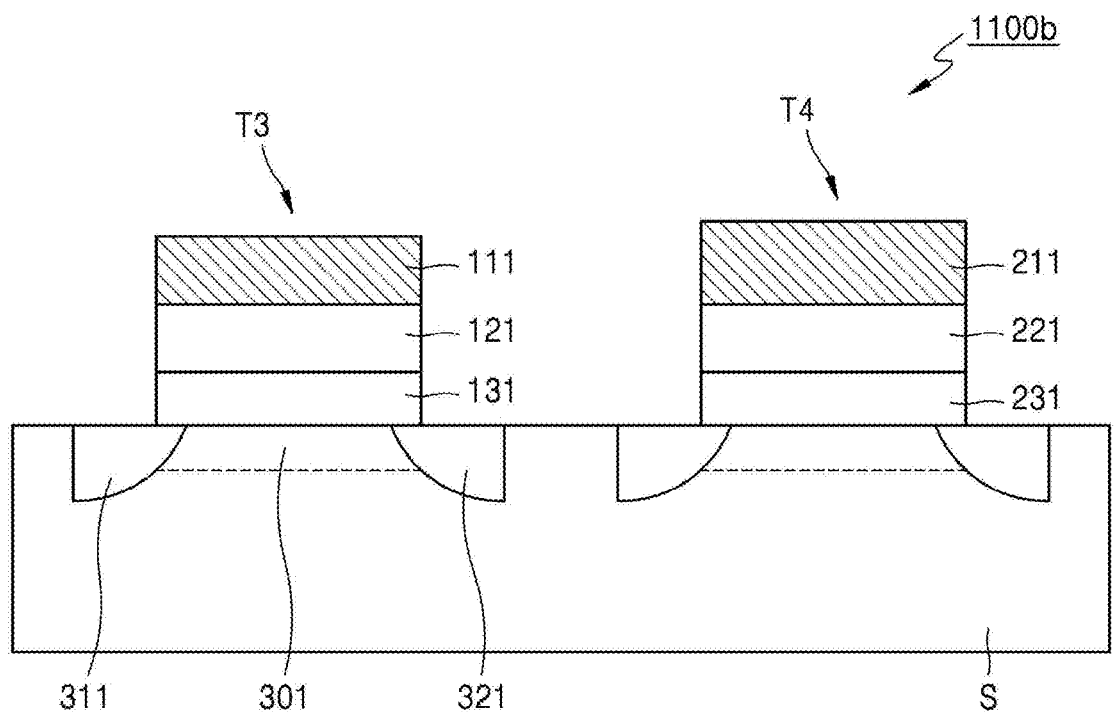

FIGS. 6A to 6B are schematic cross-sectional views of integrated circuits 1100a to 1100b including transistors, according to some embodiments.

Referring to FIGS. 6A to 6B, the integrated circuits 1100a to 1100b may include the substrate S and transistors including channel layers 301 in the substrate S, source electrodes 311 and drain electrodes 321 respectively contacting both sides of the channel layers 301, first and second gate electrodes 111 and 211 above the channel layers 301, and first and second ferroelectrics layers 121 and 221 between the channel layers 301 and the first and second gate electrodes 111 and 211. Also, electrical characteristics of the first ferroelectrics layer 121 and the second ferroelectrics layer 221 respectively included in at least two of the transistors, for example, a first transistor T3 and a second transistor T4, may differ.

Furthermore, the first transistor T3 may further include a first insulating layer 131 between the first ferroelectrics layer 121 and the channel layer 301. Also, the second transistor T4 may further include a second insulating layer 231 between the second ferroelectrics layer 221 and the channel layer 301. The first insulating layer 131 and the second insulating layer 231 may each independently include 2D materials having at least one of SiO, SiN, AlO, HfO, ZrO, and h-BN. In addition, the first insulating layer 131 and the second insulating layer 231 may include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, MgO, and a combination thereof. However, materials of the first insulating layer 131 and the second insulating layer 231 are not limited thereto. The first insulating layer 131 and the second insulating layer 231 may include any of insulating materials used in general transistors.

As described above with reference to FIGS. 1A & 1B, because the electrical characteristics of the first and second ferroelectrics layers 121 and 221 are different, threshold voltages of the first transistor T3 and the second transistor T4 may be different. In this case, at least one of materials and thicknesses of the first and second gate electrodes 111 and 211 respectively on the first and second ferroelectrics layers 121 and 221 may be different. For example, in FIG. 6A, the first gate electrode 111 and second gate electrode 211 may have the same thickness. In FIG. 6B, the first gate electrode 111 and the second gate electrode 211 may have different thicknesses (e.g., the second gate electrode 211 may be thicker than the first gate electrode 111).

Figure 7:
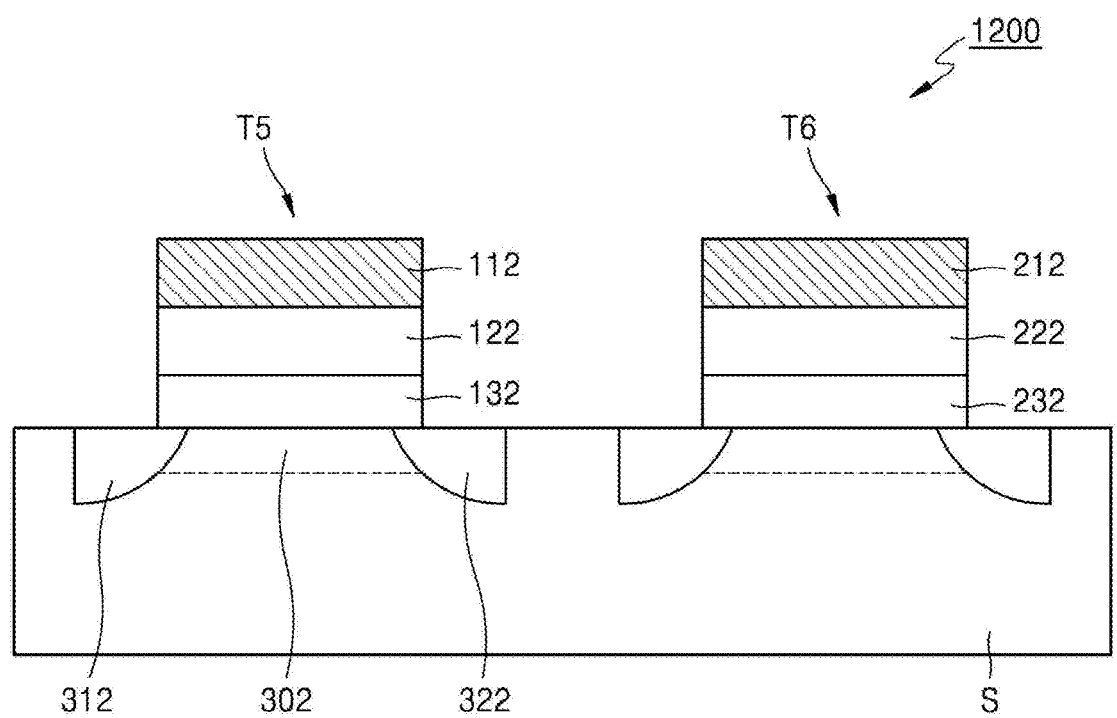
FIG. 7 is a schematic cross-sectional view of an integrated circuit including transistors, according to another embodiment.

FIG. 7 is a schematic cross-sectional view of an integrated circuit 1200 including transistors, according to another embodiment.

Referring to FIG. 7, the integrated circuit 1200 may include the substrate S and transistors including channel layers 302 in the substrate S, source electrodes 312 and drain electrodes 322 respectively contacting both sides of the channel layers 302, first and second gate electrodes 112 and 212 on the channel layers 302, and first and second ferroelectrics layers 122 and 222 between the channel layers 302 and the first and second gate electrodes 112 and 212. Also, electrical characteristics of the first ferroelectrics layer 122 and the second ferroelectrics layer 222 of at least two of the transistors, for example, a first transistor T5 and a second transistor T6, may differ.

Furthermore, the first transistor T5 may further include a first insulating layer 132 between the first ferroelectrics layer 122 and the channel layer 302. Also, the second transistor T6 may further include a second insulating layer 232 between the second ferroelectrics layer 222 and the channel layer 302. Materials of the first and second insulating layers 132 and 232 are as described above with reference to FIGS. 6A to 6B.

Unlike the integrated circuits 1100a to 1100b of FIGS. 6A to 6B, materials and thicknesses of the first gate electrode 112 of the first transistor T5 and the second gate electrode 212 of the second transistor T6 may be the same.

Figure 8A:
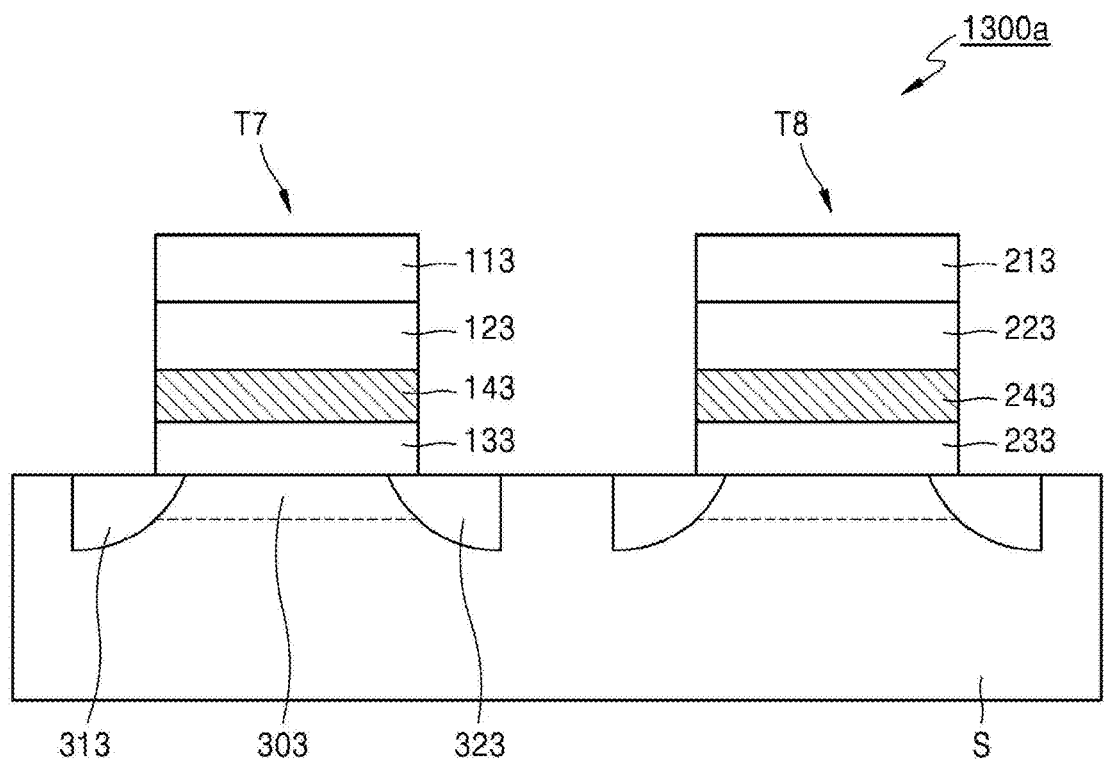
FIGS. 8A to 8B are schematic cross-sectional views of integrated circuits including transistors, according to some embodiments.
Figure 8B:
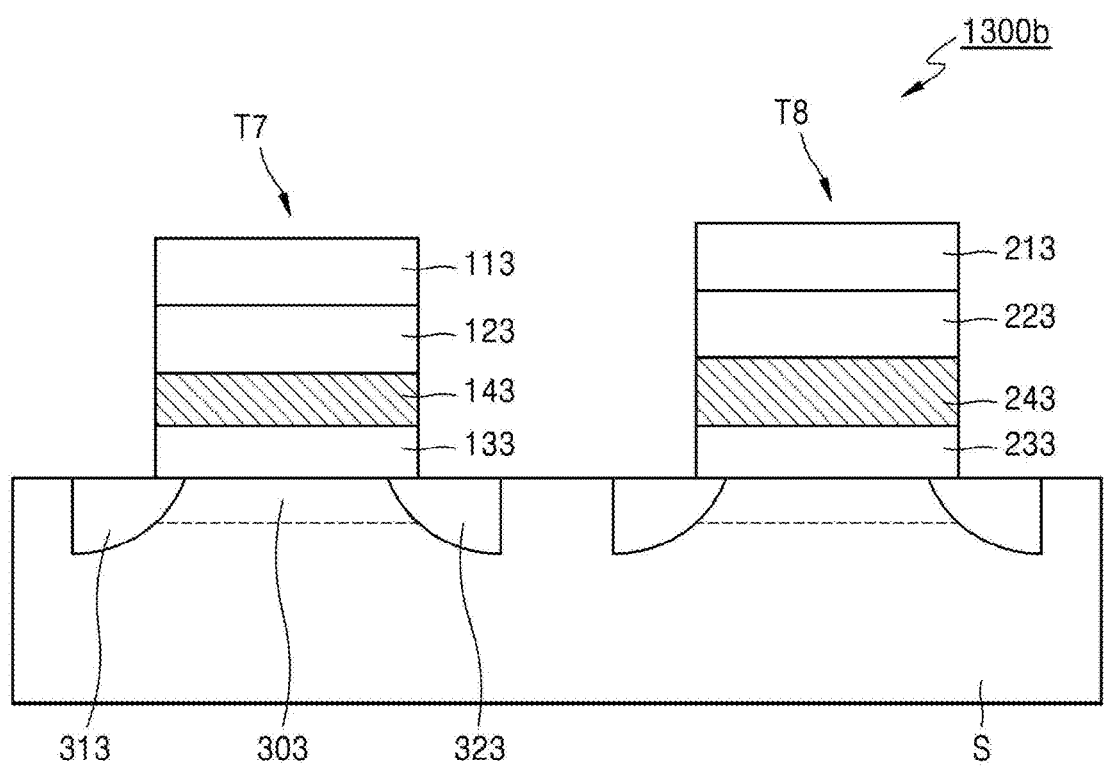

FIGS. 8A to 8B are schematic cross-sectional views of integrated circuits 1300a to 1300b including transistors, according to some embodiments.

Referring to FIGS. 8A to 8B, the integrated circuits 1300a to 1300b may include the substrate S and transistors including channel layers 303 in the substrate S, source electrodes 313 and drain electrodes 323 respectively contacting both sides of the channel layers 303, first and second gate electrodes 113 and 213 on the channel layers 303, and first and second ferroelectrics layers 123 and 223 between the channel layers 303 and the first and second gate electrodes 113 and 213. Also, electrical characteristics of the first ferroelectrics layer 123 and the second ferroelectrics layer 223 of at least two of the transistors, for example, a first transistor T7 and a second transistor T8, may differ.

Furthermore, the first transistor T7 may further include a first insulating layer 133 between the first ferroelectrics layer 123 and the channel layer 303. Also, the second transistor T8 may further include a second insulating layer 233 between the second ferroelectrics layer 223 and the channel layer 303. Materials of the first and second insulating layers 133 and 233 are as described above with reference to FIGS. 6A to 6B.

Also, the first transistor T7 may further include a first metal layer 143 between the first ferroelectrics layer 123 and the first insulating layer 133. Also, the second transistor T8 may further include a second metal layer 243 between the second ferroelectrics layer 223 and the second insulating layer 233. Materials of the first metal layer 143 and the second metal layer 243 may differ from each other and/or may have different sizes. For example, in FIG. 8A the first metal layer 143 and the second metal layer 243 may have the same size. In FIG. 8B the first metal layer 143 and the second metal layer 243 may have different sizes (e.g., the second metal layer 243 may be larger than the first metal layer 143).

Figure 9A:
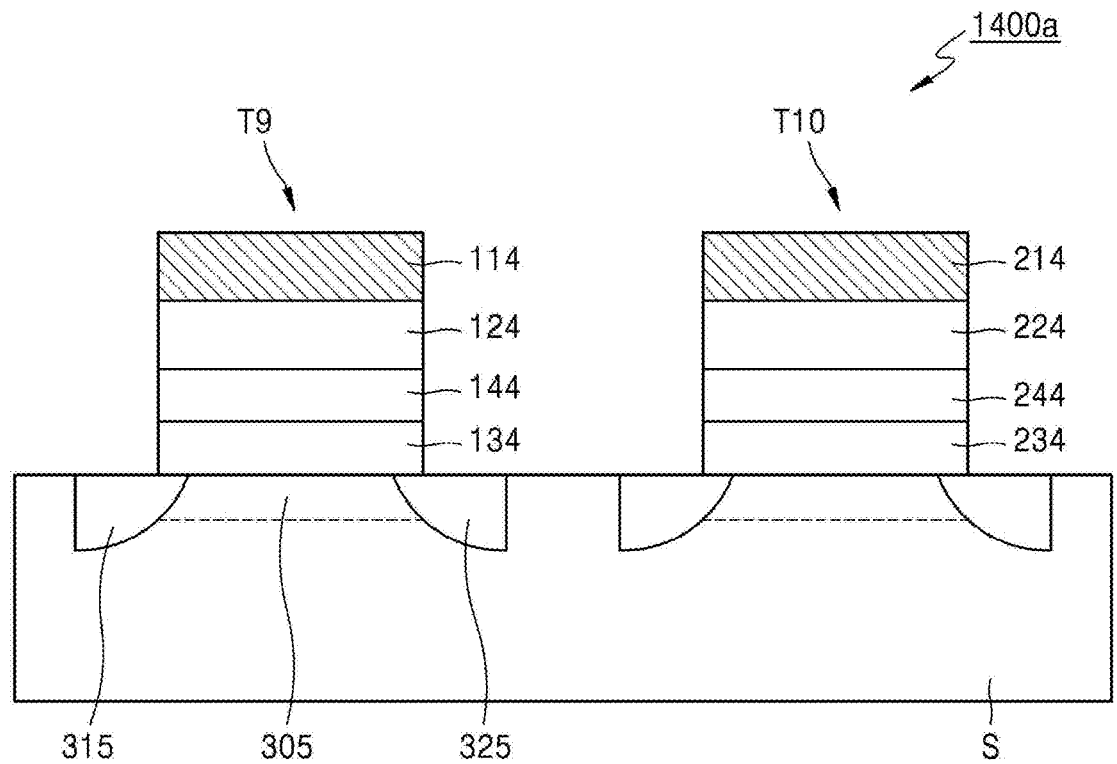
FIGS. 9A to 9B are schematic cross-sectional views of integrated circuits including transistors, according to some embodiments.
Figure 9B:
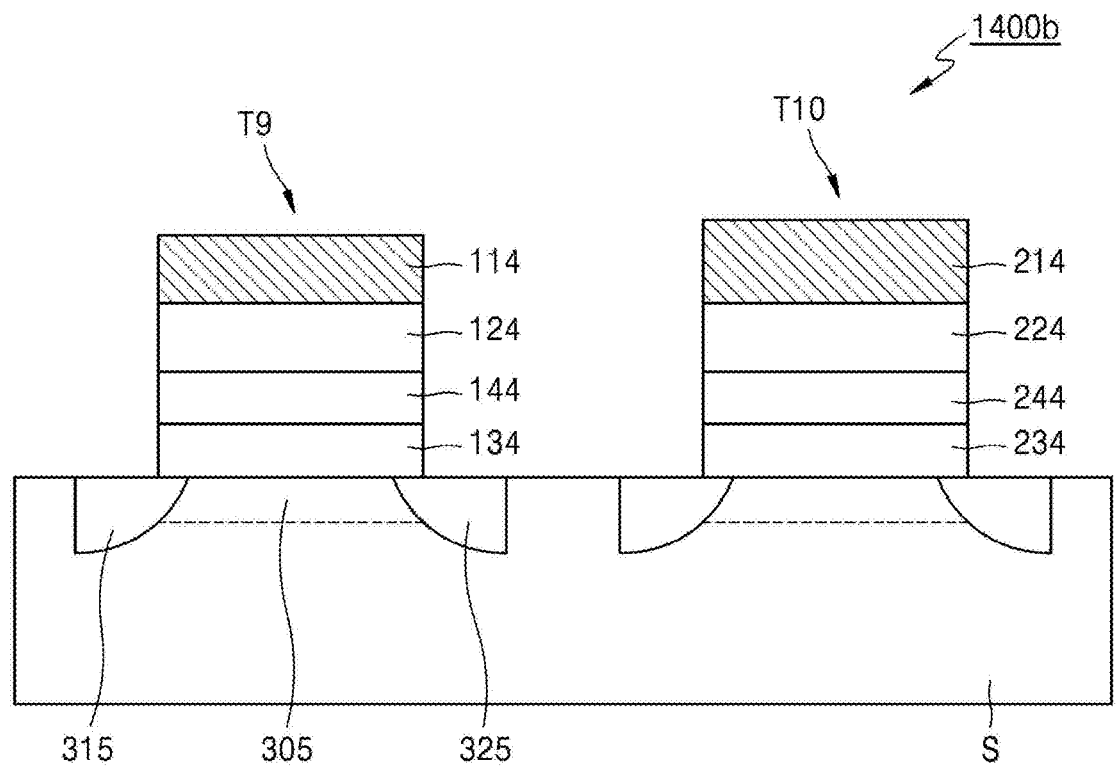

FIGS. 9A and 9B are schematic cross-sectional views integrated circuits 1400a and 1400b including transistors, according to some embodiments.

Referring to FIGS. 9A and 9B, the integrated circuits 1400a and 1400b may include the substrate S and transistors including channel layers 304 in the substrate S, source electrodes 314 and drain electrodes 324 respectively contacting both sides of the channel layers 304, first and second gate electrodes 114 and 214 on the channel layers 304, and first and second ferroelectrics layers 124 and 224 between the channel layers 304 and the first and second gate electrodes 114 and 214. Also, electrical characteristics of the first ferroelectrics layer 124 and the second ferroelectrics layer 224 of at least two of the transistors, for example, a first transistor T9 and a second transistor T10, may differ.

Furthermore, the first transistor T9 may further include a first insulating layer 134 between the first ferroelectrics layer 124 and the channel layer 304. Also, the second transistor T10 may further include a second insulating layer 234 between the second ferroelectrics layer 224 and the channel layer 304. Materials of the first and second insulating layers 134 and 234 are as described above with reference to FIGS. 6A and 6B.

Also, the first transistor T9 may further include a first metal layer 144 between the first ferroelectrics layer 124 and the first insulating layer 134. Also, the second transistor T10 may further include a second metal layer 244 between the second ferroelectrics layer 224 and the second insulating layer 234. Materials and thicknesses of the first metal layer 144 and the second metal layer 244 may be the same, but are not limed thereto.

As described above with reference to FIGS. 9A and 9B, because the electrical characteristics of the first and second ferroelectrics layers 124 and 224 are different from each other, threshold voltages of the first transistor T9 and the second transistor T10 may differ. In this case, at least one of materials and thicknesses of the first gate electrode 114 and the second gate electrode 214 may differ from each other. For example, in FIG. 9A the first gate electrode 114 and the second gate electrode 214 may have the same thickness. In FIG. 9B, the first gate electrode 114 and the second gate electrode 214 may have different thicknesses.

Figure 10A:
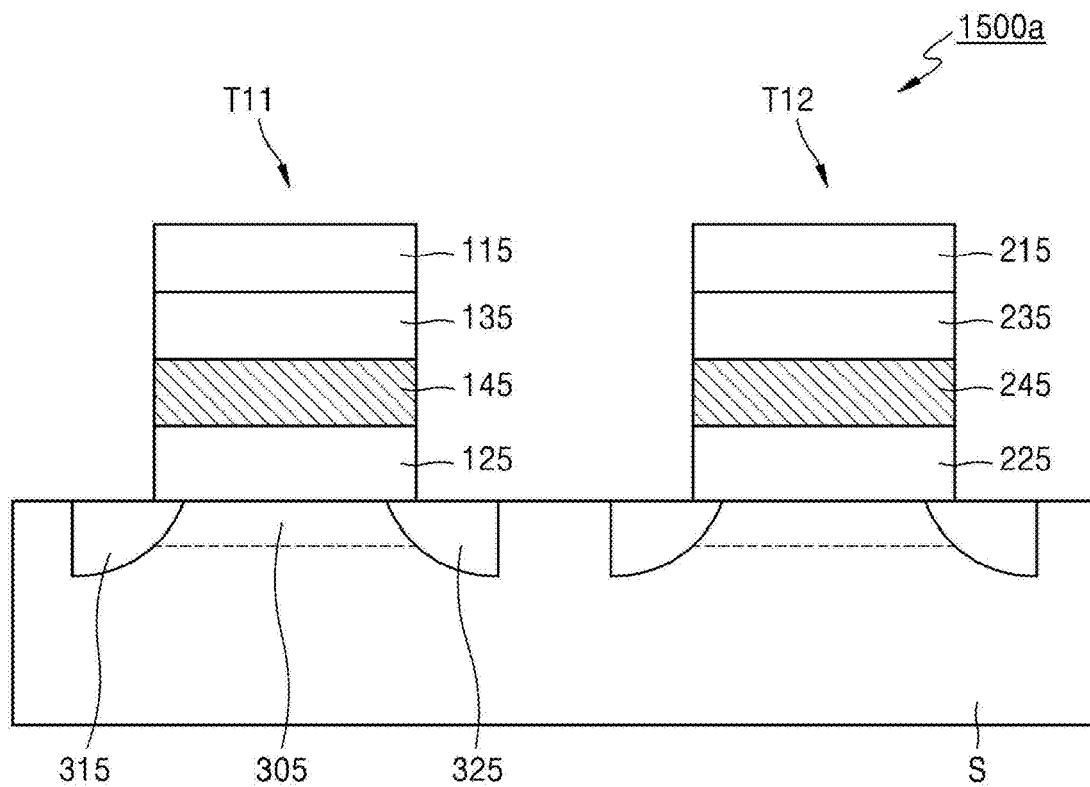
FIGS. 10A to 10B are schematic cross-sectional views of integrated circuits including transistors, according to some embodiments.
Figure 10B:
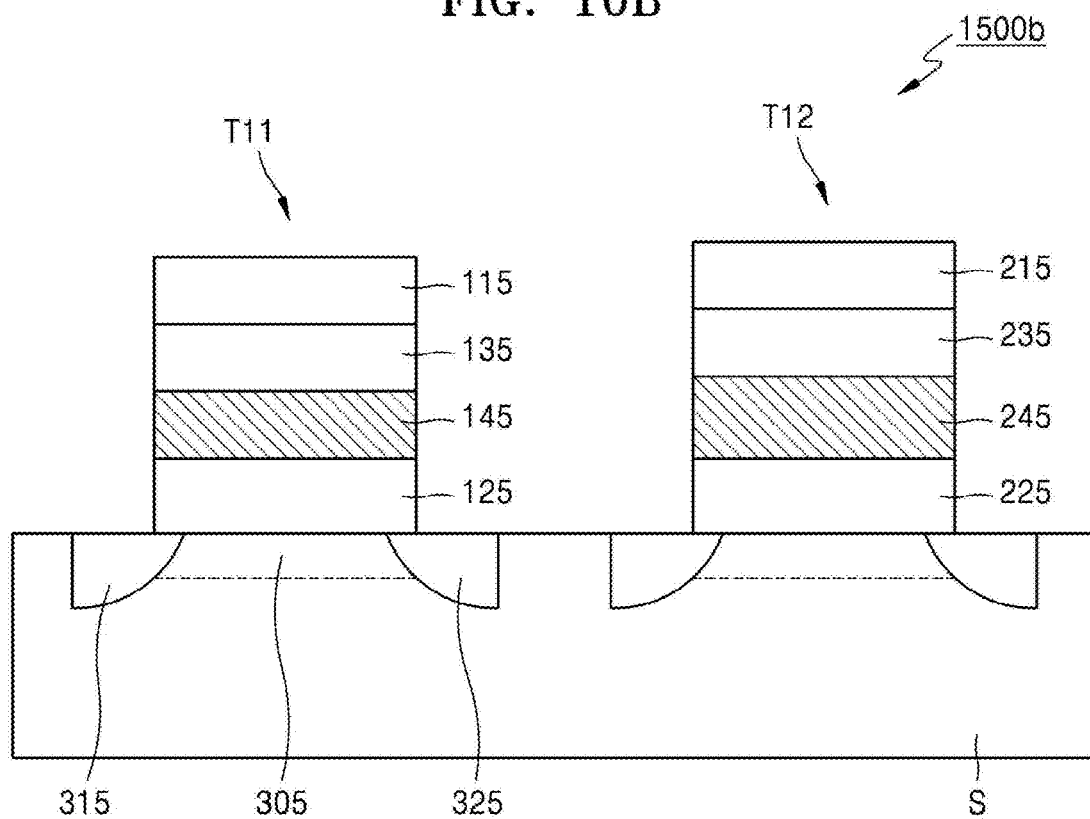

FIGS. 10A and 10B are schematic cross-sectional views of integrated circuits 1500a and 1500b including transistors, according to some embodiments.

Referring to FIGS. 10A and 10B, the integrated circuits 1500a and 1500b may include the substrate S and transistors including channel layers 305 in the substrate S, source electrodes 315 and drain electrodes 325 respectively contacting both sides of the channel layers 305, first and second gate electrodes 115 and 215 on the channel layers 305, and first and second ferroelectrics layers 125 and 225 between the channel layers 305 and the first and second gate electrodes 115 and 215. Also, electrical characteristics of the first ferroelectrics layer 125 and the second ferroelectrics layer 225 of at least two of the transistors, for example, a first transistor T11 and a second transistor T12, may differ.

Furthermore, the first transistor T11 may further include a first metal layer 145 between the first ferroelectrics layer 125 and the first gate electrode 115. Also, the second transistor T12 may further include a second metal layer 245 between the second ferroelectrics layer 225 and the second gate electrode 215. At least one of materials and thicknesses of the first metal layer 145 and the second metal layer 245 may differ from each other. For example, as shown in FIG. 10A, the first metal layer 145 and the second metal layer 245 may have the same size. As shown in FIG. 10B, the first metal layer 145 and the second metal layer 245 may have different sizes (e.g., the second metal layer 245 may be thicker than the first metal layer 145).

Also, first and second insulating layers 135 and 235 may be further formed on the first and second metal layers 145 and 245. Materials of the first and second insulating layers 135 and 235 are as described above with reference to FIGS. 6A and 6B. The first and second metal layers 145 and 245 may be spaced apart from the first and second gate electrodes 115 and 225 by the first and second insulating layers 135 and 235.

Figure 11:
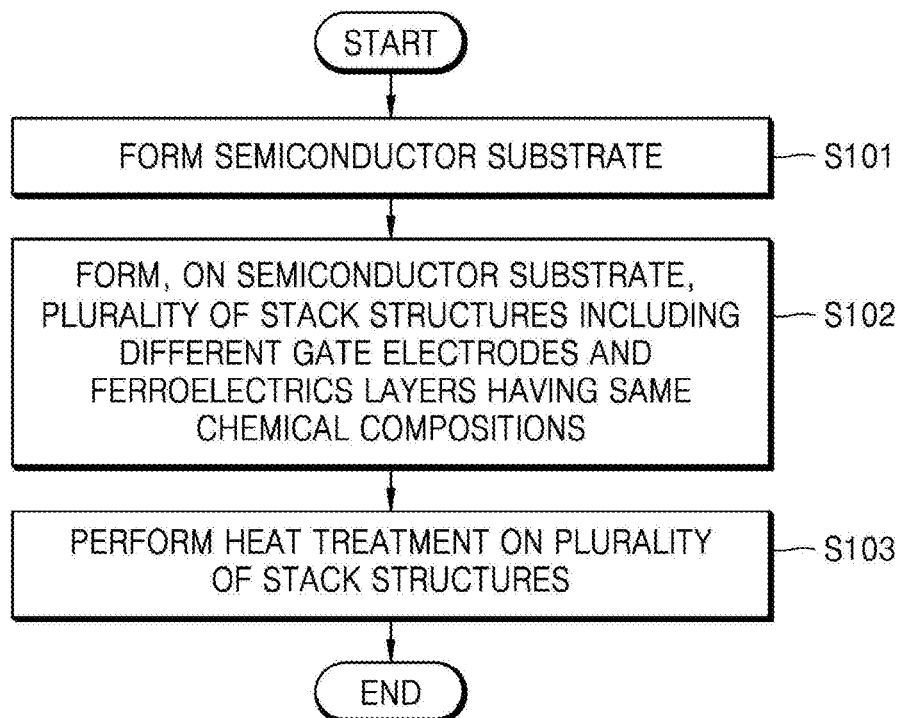
FIG. 11 is a flowchart of a method of manufacturing an integrated circuit including transistors, according to an embodiment.
Figure 12:
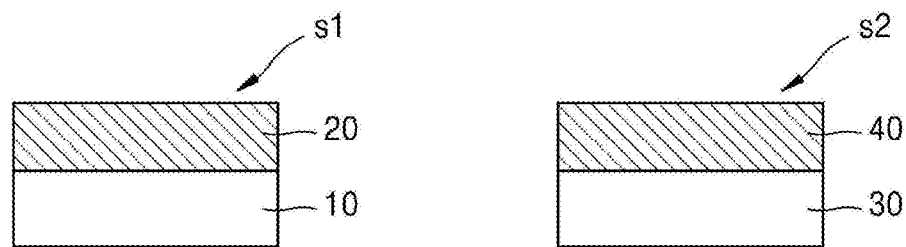
FIG. 12 is a side view of an example of first and second stack structures manufactured while an integrated circuit is manufactured, according to an embodiment.
Figure 13:
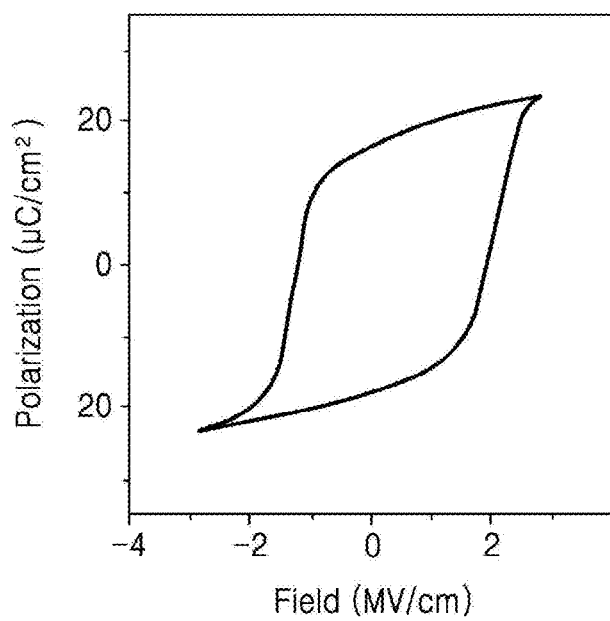
FIGS. 13 and 14 are hysteresis curves respectively indicating characteristics of first and second ferroelectrics layers.
Figure 14:
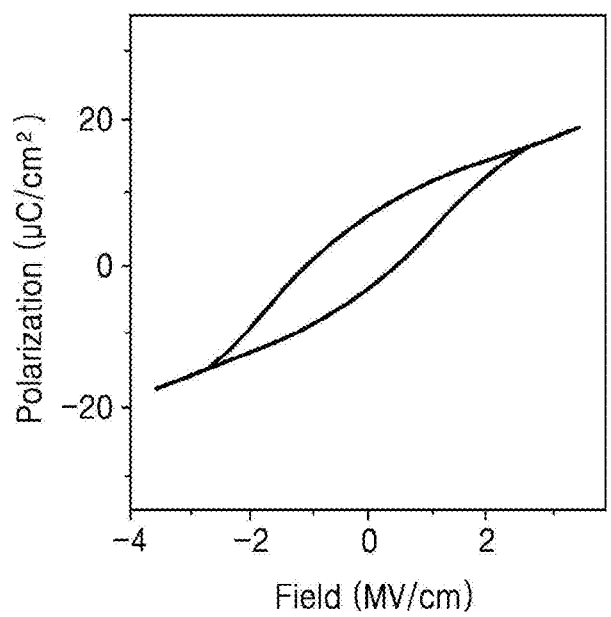

FIG. 11 is a flowchart of a method of manufacturing an integrated circuit including transistors, according to an embodiment. FIG. 12 is a side view of an example of first and second stack structures s1 and s2 manufactured while the integrated circuit is manufactured, according to an embodiment. FIGS. 13 and 14 are hysteresis curves respectively indicating characteristics of first and second ferroelectrics layers 10 and 20.

Referring to FIG. 11, the method of manufacturing the integrated circuit including the transistors may include operation s101 of forming a semiconductor substrate including channel layers, source electrodes, and drain electrodes, operation s102 of preparing stack structures in which ferroelectrics layers and gate electrodes are sequentially formed on the channel layers, respectively, and operation s103 of performing a heat treatment on the stack structures.

In operation s101 of forming the semiconductor substrate, the semiconductor substrate including the channel layers, the source electrodes, and the drain electrodes may have the same structure as a general transistor.

Referring to FIG. 12, in operation s102 of preparing the stack structures on the channel layers, the stack structures (e.g., the first stack structure s1 and the second stack structure s2) may be formed by forming gate electrodes (e.g., the first gate electrode 20 and the second gate electrode 40), of which any one of materials and thicknesses are different, on ferroelectrics layers (e.g., the first and second ferroelectrics layers 10 and 20) that have the same chemical compositions.

In operation s103 of performing the heat treatment, heat treatments under the same conditions may be performed on the first stack structure s1 and the second stack structure s2. For example, during the heat treatments performed on the first stack structure s1 and the second stack structure s2, a heat temperature, a time when heat is applied, and the like may all be identical.

Due to the above heat treatments, characteristics (e.g., volume) of the first gate electrode 20 and the second gate electrode 40 respectively included in the first stack structure s1 and the second stack structure s2 may change. As described above, because the first gate electrode 20 and the second gate electrode 40 are different from each other, the characteristics (e.g., the volume) of the first gate electrode 20 and the second gate electrode 40 may be differently changed by the heat treatments. Accordingly, different stresses may be applied to the first and second ferroelectrics layers 10 and 30 that respectively contact the first gate electrode 20 and the second gate electrode 40. Thus, crystalline phases, grain sizes, defect densities, etc. of the first and second ferroelectrics layers 10 and 30 may become different, and the electrical characteristics of the first and second ferroelectrics layers 10 and 30 become different. Accordingly, as shown in FIGS. 13 and 14, the first and second ferroelectrics layers 10 and 30 having the different electrical characteristics have different hysteresis curves.

In operation s102 of preparing the stack structures, first and second metal layers (not shown) respectively contacting the first and second ferroelectrics layers 10 and 30 may be further formed between the channel layer and the gate electrode. In this case, the first metal layer may contact a lower surface of the first ferroelectrics layer 10, and the second metal layer may contact a lower surface of the second ferroelectrics layer 30. Alternatively, the first metal layer may contact an upper surface of the first ferroelectrics layer 10, and the second metal layer may contact an upper surface of the second ferroelectrics layer 30.

Furthermore, any one of materials and thicknesses of the first and second metal layers may differ. In this case, when the same heat treatment is performed on the first and second stack structures s1 and s2, different stresses are applied to the first and second ferroelectrics layers 10 and 30 respectively contacting the first and second metal layers. Thus, the crystalline phases, grain sizes, defect densities, and the like of the first and second ferroelectrics layers 10 and 30 become different, and the electrical characteristics of the first and second ferroelectrics layers 10 and 30 become different.

As described, threshold voltages of the transistors respectively including the first and second ferroelectrics layers 10 and 30 having the different electrical characteristics may differ from each other. Power loss of the integrated circuit may decrease by manufacturing the integrated circuit including the transistors having the different threshold voltages.

Figure 15:
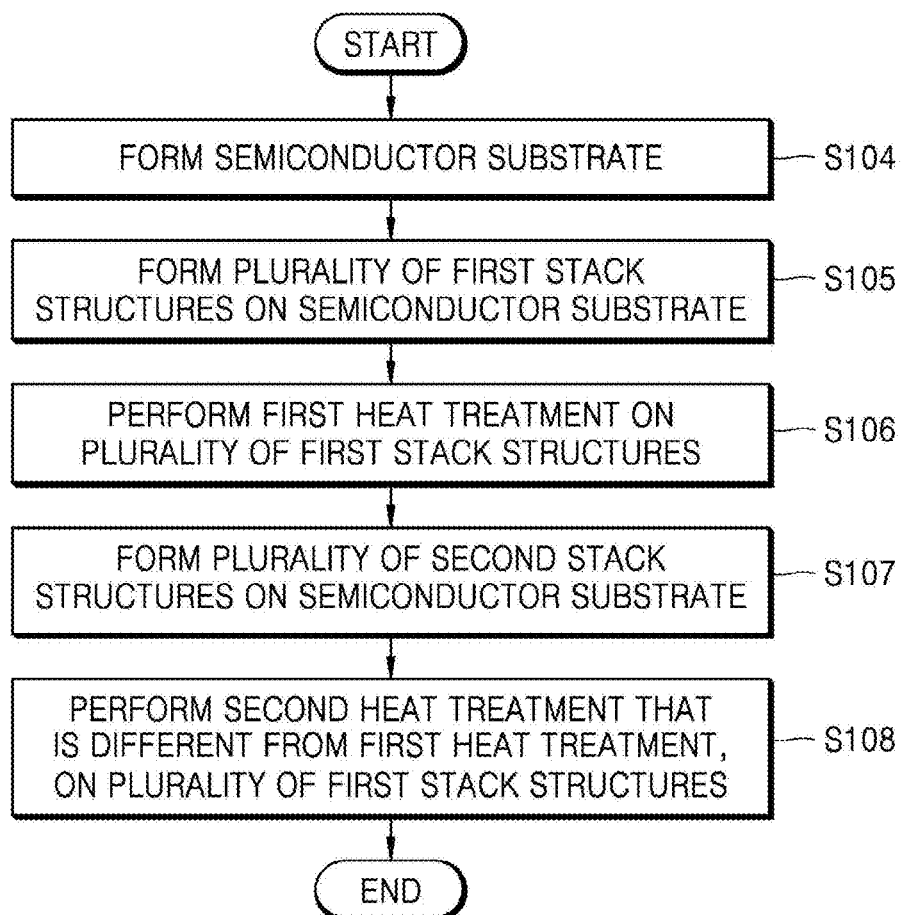
FIG. 15 is a flowchart of a method of manufacturing an integrated circuit including transistors, according to another embodiment.
Figure 16:
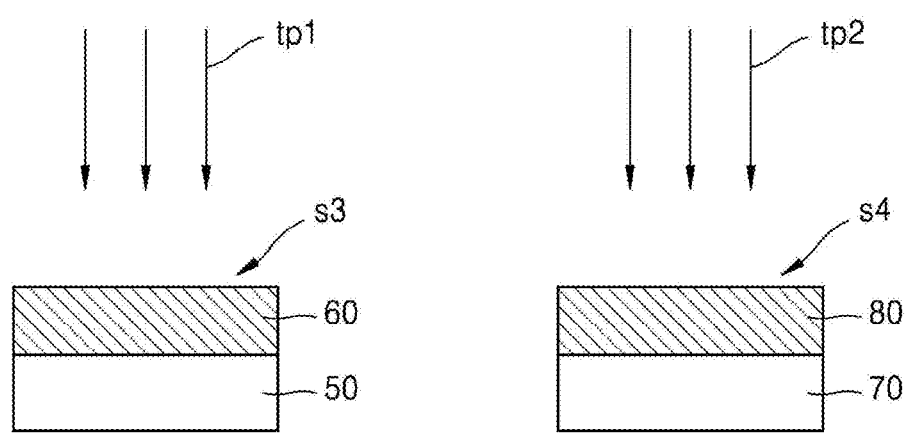
FIG. 16 is a side view of an example of first and second stack structures manufactured while an integrated circuit is manufactured, according to an embodiment.

FIG. 15 is a flowchart of a method of manufacturing an integrated circuit including transistors, according to another embodiment. FIG. 16 is a side view of an example of first and second stack structures s3 and s4 manufactured while the integrated circuit is manufactured, according to an embodiment.

Referring to FIGS. 15 and 16, the method of manufacturing the integrated circuit including the transistors may include operation s104 of forming a semiconductor substrate including channel layers, source electrodes, and drain electrodes, preparing first stack structures s3 in which first ferroelectrics layers 50 and first gate electrodes 60 are sequentially formed respectively on some of the channel layers, performing a first heat treatment tp1 on the first stack structures s3, preparing second stack structures s4 in which second ferroelectrics layers 70 and second gate electrodes 80 are sequentially formed respectively on others of the channel layers, and performing a second heat treatment tp2 on the second stack structures s4.

Referring to FIG. 16, in operation s102 of FIG. 15, the stack structures (e.g., the first stack structures s3 and the second stack structures s4) may be formed by forming the gate electrodes (e.g., the first gate electrodes 60 and the second gate electrodes 80) on the ferroelectrics layers (e.g., the first ferroelectrics layers 50 and the second ferroelectrics layers 70) having the same chemical compositions. In this case, characteristics, e.g., materials, thicknesses, etc., of the first and second gate electrodes 60 and 80 may all be the same.

During the performing of the first heat treatment tp1 and the second heat treatment tp2, temperatures of heat applied to the first stack structures s3 and the second stack structures s4 may be different. Also, during the first heat treatment tp1 and the second heat treatment tp2, periods during which the heat is applied to the first stack structures s3 and the second stack structures s4 may be different. As described, heat treatment methods performed on the first stack structures s3 and the second stack structures s4 may differ.

In this case, although characteristics such as materials and thicknesses of the first and second gate electrodes 60 and 80 are the same, changes in characteristics (e.g., volume) of the first heat treatment tp1 and the second heat treatment tp2 may differ, the changes being caused by the first heat treatment tp1 and the second heat treatment tp2. Accordingly, stresses, etc., that are applied to the first and second ferroelectrics layers 50 and 70 contacting the first and second gate electrodes 60 and 80 may differ, and thus, crystalline phases, grain sizes, defect densities, etc. of the first and second ferroelectrics layers 50 and 70 may become different. As described, although the first and second ferroelectrics layers 50 and 70 have the same chemical compositions, the electrical characteristics of the first and second ferroelectrics layers 50 and 70 may differ. Threshold voltages of the transistors including the first and second ferroelectrics layers 50 and 70 having different electrical characteristics may differ.

Consequently, by performing the first heat treatment tp1 and the second heat treatment tp2 on the first stack structure s3 and the second stack structure s4, an integrated circuit including transistors having different threshold voltages may be manufactured. Therefore, power loss of the integrated circuit may decrease.

The transistors included in the integrated circuit according to one or more embodiments may have different threshold voltages due to the ferroelectrics layers having different electrical characteristics.

According to the method of manufacturing the integrated circuit according to the one or more embodiments of the disclosure, because the electrical characteristics of the ferroelectrics layers included in the transistors are differently set, threshold voltages of transistors may become different by using a simplified method. Therefore, power loss of the integrated circuit including the transistors may decrease more conveniently.

It should be understood that an integrated circuit including transistors and a method of manufacturing the same described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A semiconductor device comprising:
a first transistor comprising a first source, a first drain, a first channel, a first ferroelectrics layer, and a first gate electrode; and
a second transistor comprising a second source, a second drain, a second channel, a second ferroelectrics layer, and a second gate electrode;
wherein the first ferroelectrics layer and the second ferroelectrics layer have different grain sizes, and
the first ferroelectrics layer and the second ferroelectrics layer have different defect densities.

2. The semiconductor device of claim 1, wherein the first ferroelectrics layer includes a larger grain size than the second ferroelectrics layer.

3. The semiconductor device of claim 1, wherein the first ferroelectrics layer and the second ferroelectrics layer comprise a same chemical composition.

4. The semiconductor device of claim 1, wherein the first ferroelectrics layer and the second ferroelectrics layer include at least one of crystalline phase selected among an orthorhombic phase, a tetragonal phase, and a monoclinic phase.

5. The semiconductor device of claim 4, wherein a content of the tetragonal phase included in the first ferroelectrics layer is different from that of the tetragonal phase included in the second ferroelectrics layer.

6. The semiconductor device of claim 1, wherein the first transistor further includes at least one of an insulating layer and a metal layer between the first gate electrode and the first channel layer.

7. The semiconductor device of claim 6, wherein
the first transistor and the second transistor each include the metal layer,
the metal layer of the first transistor is different than the metal layer of the second transistor in terms of at least one of a material or a thickness.

8. The semiconductor device of claim 1, wherein
the first gate electrode is different than the second gate electrode in terms of at least one of a material or a thickness.

9. The semiconductor device of claim 1, wherein a top surface of the first ferroelectrics layer is level with a top surface of the second ferroelectrics layer.

10. The semiconductor device of claim 1, wherein a threshold voltage of the first transistor is different than a threshold voltage of the second transistor.

11. The semiconductor device of claim 1, wherein a hysteresis characteristic of polarization versus electric field in the first transistor is different than a hysteresis characteristic of polarization versus electric field in the second transistor.

12. The semiconductor device of claim 1, wherein at least one of the first ferroelectrics layer and the second ferroelectrics layer includes at least one of $HfO_2$, $Hf_xZr_{1-x}O_2$ ($0<x<1$), or $ZrO_2$.

13. The semiconductor device of claim 1, wherein at least one of the first channel and the second channel includes Si, Ge, a III-V semiconductor compound, a 2D material, a transition-metal dichalcogenides (TMDC), or an organic semiconductor.

14. The semiconductor device of claim 1, wherein the first channel and the second channel have substantially a same doping concentration.

15. A semiconductor device comprising:
a first transistor comprising a first source, a first drain, a first channel, a first ferroelectrics layer, and a first gate electrode; and
a second transistor comprising a second source, a second drain, a second channel, a second ferroelectrics layer, and a second gate electrode;

wherein the first ferroelectrics layer and the second ferroelectrics layer have different grain sizes, and wherein the first ferroelectrics layer and the second ferroelectrics layer include different crystalline phases selected from among an orthorhombic phase, a tetragonal phase, and a monoclinic phase.

16. The semiconductor device of claim 15, wherein a content of the tetragonal phase included in the first ferroelectrics layer is different a content of the tetragonal phase included in the second ferroelectrics layer.

17. The semiconductor device of claim 15, wherein the first ferroelectrics layer and the second ferroelectrics layer comprise a same chemical composition.

18. A semiconductor device comprising:
a first transistor comprising a first source, a first drain, a first channel, a first ferroelectrics layer, and a first gate electrode; and
a second transistor comprising a second source, a second drain, a second channel, a second ferroelectrics layer, and a second gate electrode;

wherein the first ferroelectrics layer and the second ferroelectrics layer have different grain sizes, and wherein a threshold voltage of the first transistor is different than a threshold voltage of the second transistor.

19. The semiconductor device of claim 18, wherein
the first ferroelectrics layer and the second ferroelectrics layer comprise a same chemical composition, and
the first gate electrode is different than the second gate electrode in terms of at least one of a material or a thickness.

20. The semiconductor device of claim 18, wherein
the first ferroelectrics layer and the second ferroelectrics layer comprise a same chemical composition, and
the first transistor and the second transistor each include a metal layer,
the metal layer of the first transistor is different than the metal layer of the second transistor in terms of at least one of a material or a thickness.

* * * * *